United States Patent [19]
Basavanhally et al.

[11] Patent Number: 5,212,754
[45] Date of Patent: May 18, 1993

[54] OPTICAL LASER CONNECTOR

[75] Inventors: Nagesh R. Basavanhally, Trenton, N.J.; D. Bruce Buchholz, Woodridge, Ill.; Anthony F. J. Levi, Summit, N.J.; Ronald A. Nordin, Naperville, Ill.

[73] Assignee: AT&T Bell Laboratories, Murray Hill, N.J.

[21] Appl. No.: 815,296

[22] Filed: Dec. 27, 1991

[51] Int. Cl.$^5$ .............................. G02B 6/36
[52] U.S. Cl. ............................. 385/90; 385/88
[58] Field of Search ............ 385/88, 90, 91, 63, 385/65, 83

[56] References Cited

U.S. PATENT DOCUMENTS

| | | | |
|---|---|---|---|
| 4,515,434 | 5/1985 | Margolin et al. | 385/65 |
| 4,730,198 | 3/1988 | Brown et al. | 385/91 |
| 4,744,267 | 5/1988 | Chande et al. | 385/83 |
| 4,952,263 | 8/1990 | Kakii et al. | 385/65 |
| 5,073,045 | 12/1991 | Abendschein | 385/90 |
| 5,073,046 | 12/1991 | Edwards et al. | 385/90 |

OTHER PUBLICATIONS

"Flip-Chip Solder Bond Mounting of Laser Diodes," by C. Edge et al., *Electronics Letters*, Mar. 14, 1991, vol. 27, No. 5 p. 499.
"Passive Coupling of InGaAsp/Inp Laser Array and Singlemode Fibers using Silicon Waferboard," by C. A. Armiento et al., *Electronics Letters*, Jun. 6, 1991, vol. 27, No. 12, p. 1109.
"Passive Laser-Fiber Alignment by Index Method," by M. S. Cohen et al., *IEEE Transactions Photonics Technology Letters*, Nov. 1991, vol. 3, No. 11, p. 985.

*Primary Examiner*—John D. Lee
*Assistant Examiner*—John Ngo
*Attorney, Agent, or Firm*—Dwight A. Marshall

[57] ABSTRACT

Connector apparatus for coupling an optical fiber cable with laser devices. The apparatus comprises a receptacle terminating aligned fibers of the optical cable in a planar surface perpendicular to a central axis of the receptacle. A plug mounts a plurality of laser devices each having an electrical terminal for connecting a laser device to an external source and an optical terminal aligned in a planar surface perpendicular to a central axis of the plug with each optical terminal positioned to correspond with one of the receptacle fibers. The plug slidably engages the receptacle and is affixed thereto to position the receptacle planar surface adjacent to and aligned with the plug planar surface to optically couple each laser device with a corresponding fiber of the optical cable.

7 Claims, 4 Drawing Sheets

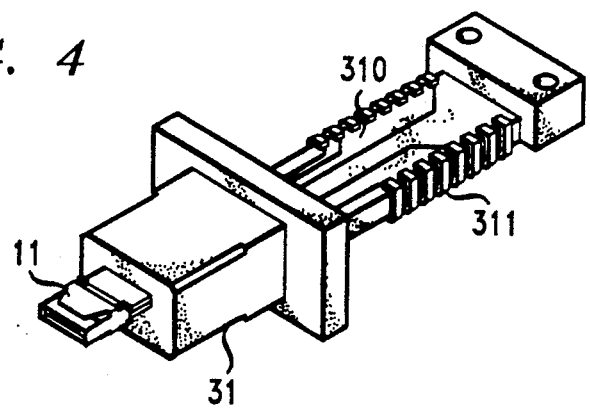
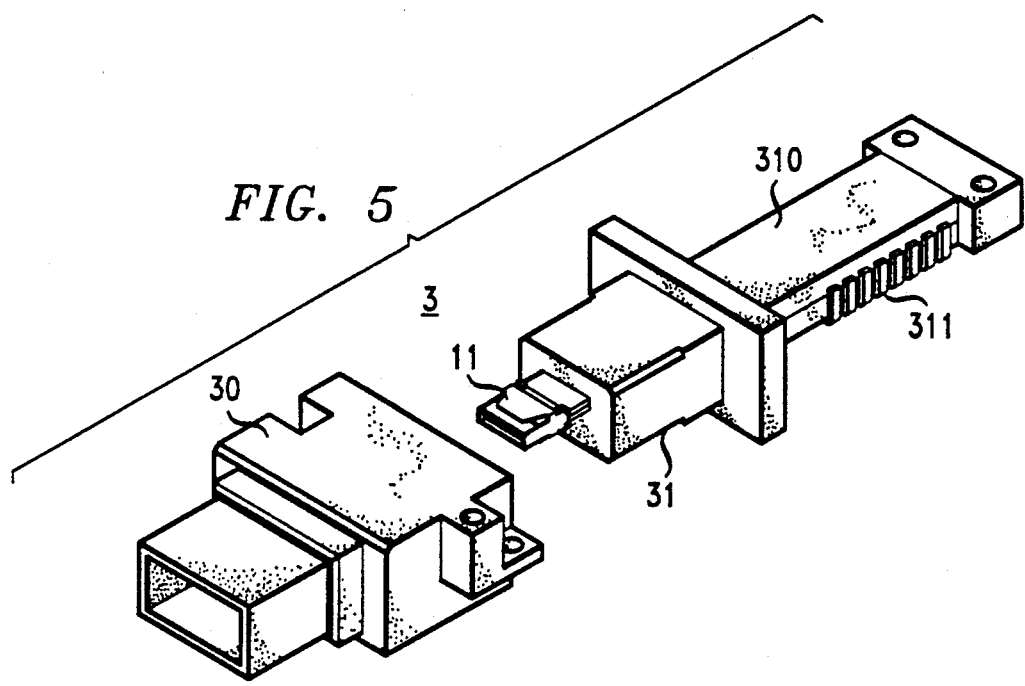
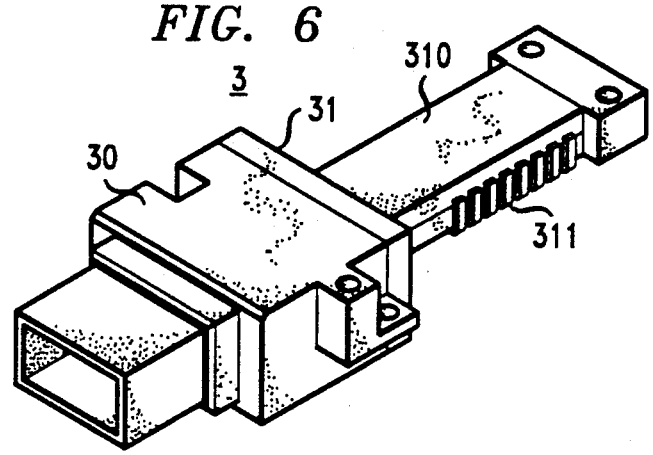

OPTICAL LASER CONNECTOR

FIELD OF THE INVENTION

The invention relates to apparatus for connecting an optical cable with laser devices.

BACKGROUND OF THE INVENTION

Electrical apparatus such as communication and computer equipment oftentimes require a large number of parallel transmission paths for interconnecting various components of the equipment. In such applications, optical fiber cables are increasingly being used as the transmission path medium. Typically, the electrical apparatus has circuit structures mounting laser devices, each having an electrical terminal affixed to conductor paths of the circuit structure. The laser devices also have an optical terminal which is required to be optically coupled with a fiber of an optical cable. Alignment of a laser device optical terminal with a fiber of the optical cable is particularly difficult due to a requirement that the fiber must be precisely positioned and aligned with respect to the optical terminal of the laser device.

Elaborate structures have been devised to couple laser device optical terminals with fibers of the optical cable. One such structure has a surface etched to form alignment pedestals with vertical walls wherein a mounting procedure is performed on a heated stage using a vacuum pick to securely manipulate a laser device against an alignment pedestal to couple the laser device optical terminal with an optical fiber. Another structure uses an index design that requires an alignment plate for defining the position of a laser device optical terminal with an optical fiber.

Electrical apparatus is often constructed with circuit structures which are interconnected to form the electrical apparatus. To interconnect the circuit structures optically, the circuit structures mount laser devices which are coupled by the above set forth structures to ones of the optical fibers. Many of the circuit structures are circuit boards which are plugged into backplanes designed to interconnect the plug-in circuit boards to form the electrical apparatus. The circuit boards are originally plugged into the backplanes to initially construct the electrical apparatus. The circuit boards may be removed to repair the apparatus, added to update the apparatus and changed at other times for various other purposes.

A problem arises in that the use of the above set forth elaborate structures results in the attachment of the optical fibers to the circuit structure laser devices that make it impossible to remove a circuit structure from the electrical apparatus without destroying the existing structure. The destruction of the structure makes it necessary to build another structure to couple the new circuit structure laser devices with the optical fibers. Accordingly, a need exists for connector apparatus for connecting an optical cable with laser devices and in particular, for connecting optical fibers and laser devices with plug-in types of circuit boards.

SOLUTION

The foregoing problem is solved by apparatus arranged for connecting an optical cable with laser devices and in particular with connector apparatus mounting laser devices therein and which connector apparatus is arranged to connect optical cable fibers via the connector mounted laser devices with plug-in types of circuit boards. The apparatus comprises a receptacle member terminating ends of aligned fibers of an optical cable in a receptacle member planar surface positioned perpendicular to a central axis of the receptacle member. A plug member mounts a plurality of laser devices therein with each laser device having an electrical terminal for connecting a laser device to an external electrical source and an optical terminal aligned in a plug member planar surface positioned perpendicular to a central axis of the plug member with each optical terminal positioned within the plug member planar surface to correspond with one of the receptacle planar member optical fiber ends. The plug member slidably engages the receptacle member to position the receptacle member planar surface adjacent to the plug member planar surface with each laser device optical terminal aligned with a corresponding fiber end to optically couple each laser device with a fiber of the optical cable.

BRIEF DESCRIPTION OF THE DRAWING

FIG. 4 is a partial view of a plug member of another embodiment of the connector apparatus set forth in FIGS. 1, 2 and 3 for surface mounting on a circuit board, and FIGS. 5 and 6 illustrate exploded and assembled views of a surface mount connector apparatus embodying the principles of the invention.

DETAILED DESCRIPTION

Figure 1:
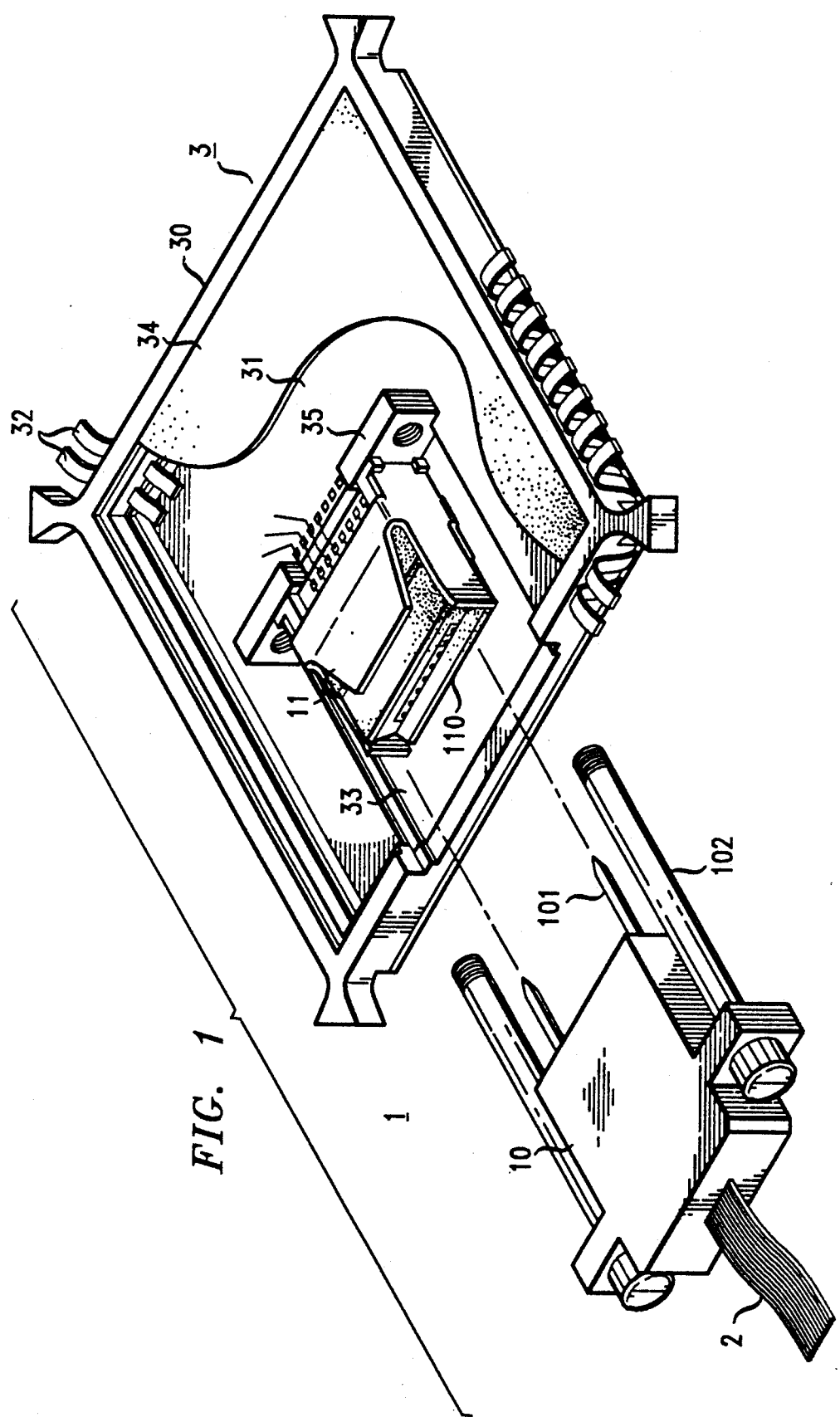
FIG. 1 is an illustrative view of connector apparatus in accordance with the principles of the invention for mounting laser devices within the connector apparatus.

Connector apparatus 1, FIG. 1, is intended for use in connecting optical cable 2 with a laser device 110 mounted within connector apparatus 1. In an exemplary embodiment of the invention, a plug member 11 of connector apparatus 1 is mounted within a structure 3 that is intended for mounting on a circuit structure such as a circuit board which may be plugged into electrical apparatus. Circuit boards are well known and need not be shown for an understanding of connector apparatus 1. Sufficient to say, that the circuit board has components mounted thereon that control and are controlled by the laser devices, such as laser transmitters and receivers, mounted in connector apparatus 1. The circuit board components are interconnected by electrically conducting paths located on the circuit board and terminated at terminal pads. In assembly, structure 3 is positioned on a circuit board and surface mounting terminals 32 are affixed to corresponding ones of the circuit board terminal pads such that electrical conducting paths are established between structure 3 and the circuit board components.

Figure 2:
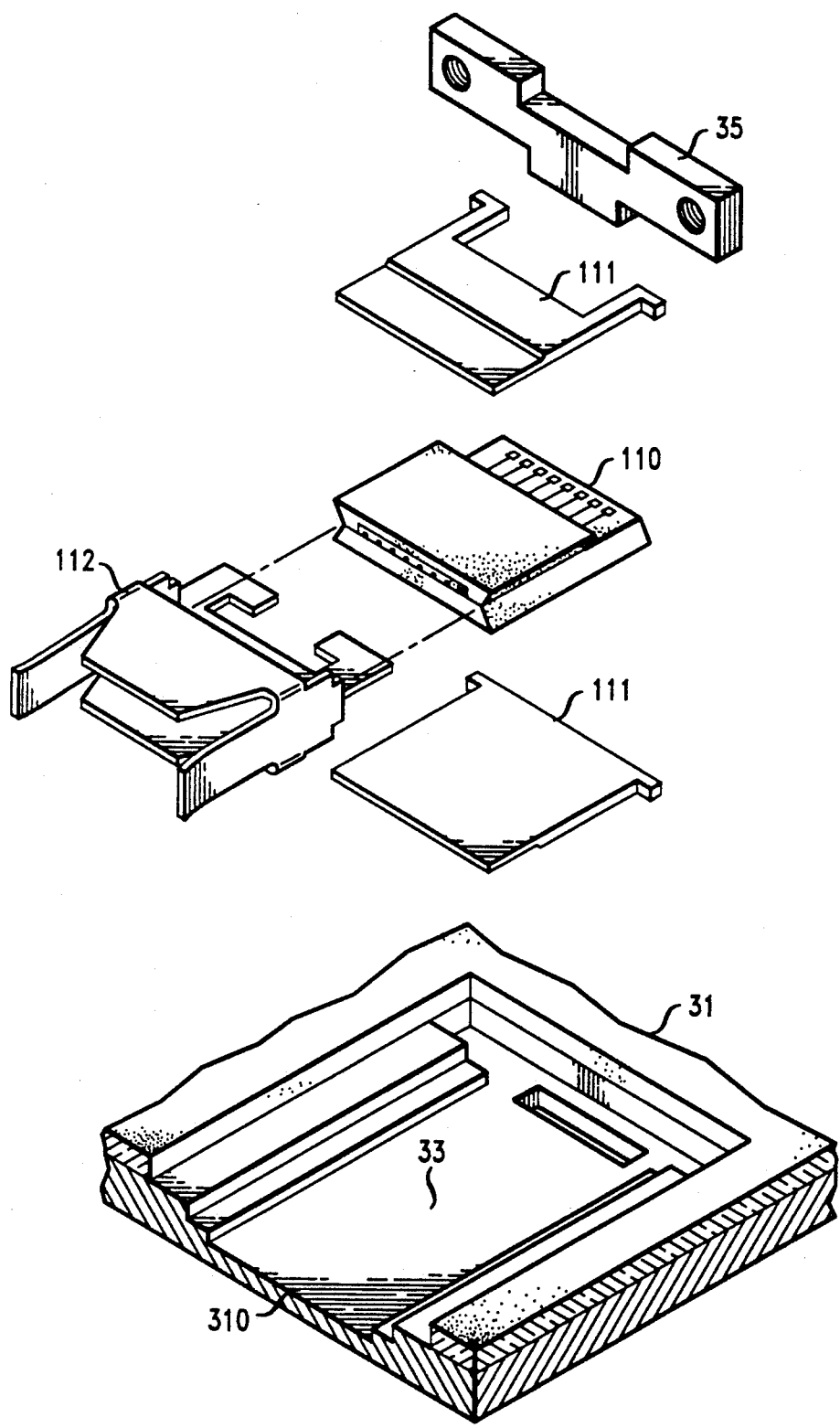
FIG. 2 illustrates a plug member of connector apparatus set forth in FIG. 1 for connecting an optical fiber cable via laser devices to a circuit board.

Structure 3 comprises a generally rectangular ceramic affixed to a metal heat spreader forming member 31 having a "T" configured cavity 33 formed therein to receive plug member 11. The end portion of cavity 33, FIG. 2, is configured to receive retaining member 35 with plug member 11, FIG. 1, positioned adjacent thereto with an end extending down into leg portion 310 of "T" cavity 33, FIG. 2. Member 31, FIG. 1, is positioned within a generally rectangularly configured frame 30 having a number of surface mounting terminals 32 positioned around the perimeter and terminated with corresponding electrical terminals located around the edges of the ceramic portion of member 31. The ceramic portion of member 31 has electrical conducting paths that serve to electrically couple connector plug member 11 with appropriate ones of surface mounting terminals 32. A lid 34 is positioned over member 31 and secured within frame 30 to complete structure 3. One side of frame 30, adjacent the leg portion 310 of "T" cavity 33, FIG. 2, is formed into an opening for receiving receptacle member 10, FIG. 1, of connector apparatus 1 to mate with plug member 11 and slidably couple optical cable 2 with circuit board components through laser devices mounted within plug member 11.

Figure 3:
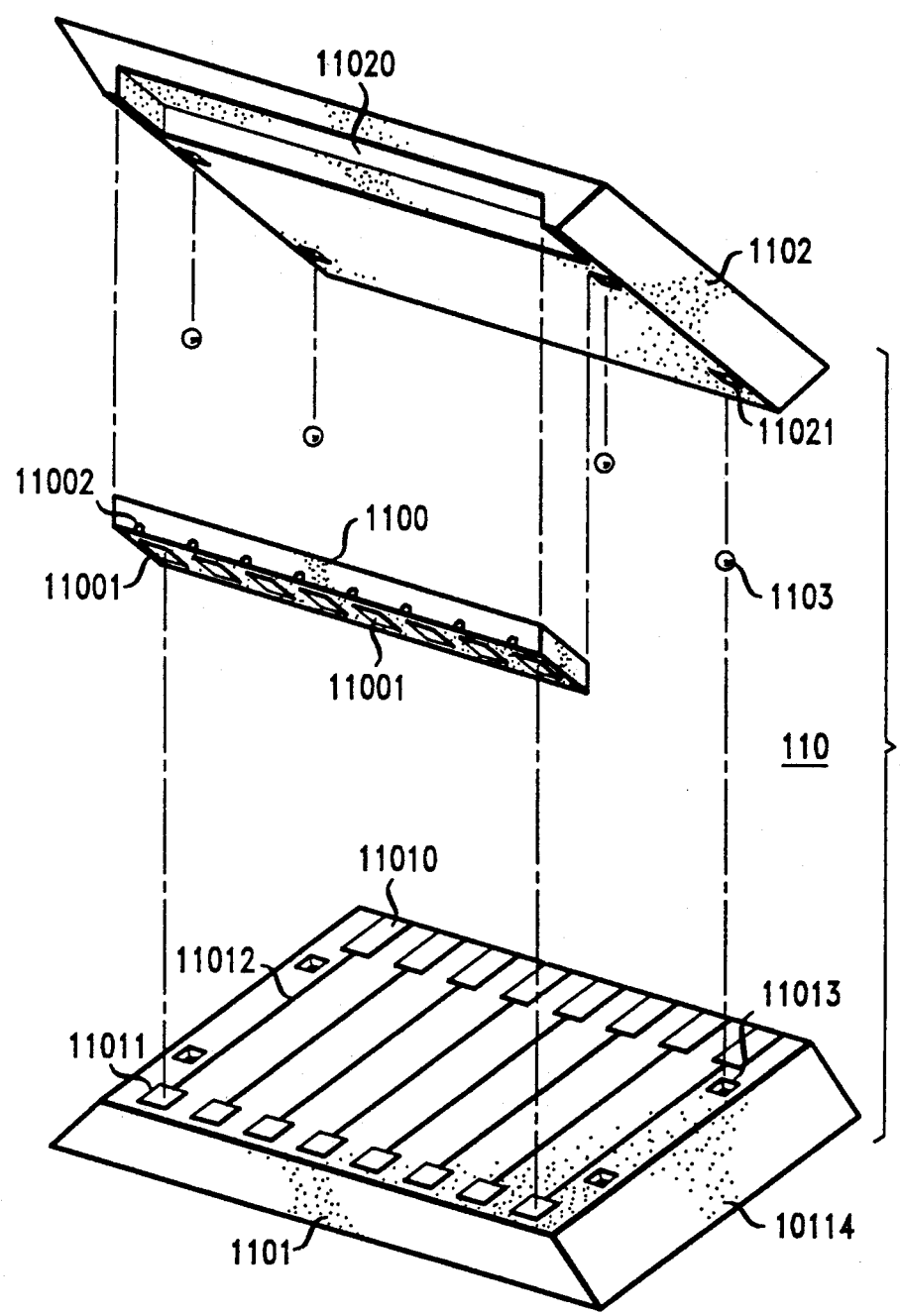
FIG. 3 is an illustrative view of connector apparatus in accordance with the principles of the invention for mounting laser devices within the connector apparatus of FIGS. 1 and 2.

Plug member 11 has a structure 110, FIG. 3, mounting laser devices 1100. Structure 110 comprises a silicon base 1101 having a pair of rows of aligned connector pads 11010, 11011 each located on an opposing edge of silicon base 1101. Each one of a pair of connector pads 11010, 11011 is interconnected to the other by an electrical conducting path 11012. Laser device 1100 is mounted along one edge with an electrical terminal 11001 of each laser device affixed to one connector pad 11011. Laser device 1100 is positioned on silicon base 1101 with optical terminals 11002 of each laser positioned within a planar surface located perpendicular to a central axis of plug member 11 and parallel to laser device optical terminals 11002. Structure 110 includes a silicon cap 1102 having a cavity 11020 formed therein for receiving a top portion of laser device 1100. Faceted alignment cavities 11013, 11021 are formed within top and bottom surfaces of silicon base 1101 and cap 1102, respectively, to receive sapphire spheres 1103 so that cap 1102 may be positioned in alignment with the silicon base 1101.

In alignment, laser device 1100 is located in an assembly comprising silicon base 1101 and cap 1102 with each laser device optical terminal 11002 positioned parallel thereto and within the planar surface of plug member 11. A pair of copper plates 111, FIG. 2, are each placed outside of opposite sides of the silicon base and cap assembly for electrically shielding and dissipating heat generated by laser device 1100. Opposing sides 11014, 11022, FIG. 3, of silicon base 1101 and cap 1102 are beveled at angle determined by the crystalline structure of the base and top silicon material to form a "V" configured groove to receive alignment pins 101, FIG. 1, of receptacle member 10. Clip 112, FIG. 2, encloses the assembly of copper plates 111 and structure 110 and completes the structure of plug member 11.

Receptacle member 10, FIG. 1, is used to terminate optical cable 2 which may either comprise a single or a number of optical fibers each aligned in a horizontal planar surface of optical cable 2. Receptacle member 10 has been used in prior applications to interconnect fibers of a pair optical cables and need not be described in detail for an understanding of the instant invention. Sufficient to say that receptacle member 10 includes a pair of silicon substrate members each having channels formed to receive one of the optical fibers. Each substrate member is secured to the other with one edge of the combined substrates formed into a planar surface located perpendicular to a central axis of receptacle member 10 with each end of the optical fibers positioned within the receptacle member planar surface and parallel thereto. Receptacle member 10 also includes a housing member enclosing the assembled silicon members. A pair of aligning pins 101, in combination with a pair of retaining screws 102, extend outward from the end of receptacle member 10.

In assembly, receptacle member 10 is inserted into the opening of structure 3 to extend into leg portion 310 of "T" cavity 33, FIG. 2. Receptacle member 10 slidably engages plug member 11 by inserting alignment pins 101 into "V" configured grooves 11014, 11022, FIG. 3, between edges of clip 112, FIG. 1. Alignment pins 101 engage the "V" configured grooves formed by beveled sides 11014, 11022 and function to position plug member planar surface containing optical terminals 11002 into alignment with the planar surface of receptacle member 10 such that each laser device optical terminal 11002 is aligned with a corresponding end of a fiber of the optical cable 2, FIG. 1. Retaining screws 102 are inserted into retaining device 35 and tightened to position plug member 11 planar surface adjacent to receptacle member 10 planar surface and aligned parallel to the other to optically couple each laser device with a corresponding optical fiber. Retaining screws 102 may be subsequently loosened to release receptacle member 10 so the receptacle member may be easily disengaged from plug member 11 thereby enabling a circuit board to be removed from the electrical apparatus.

In another embodiment of the invention, plug member 11, FIG. 4, may be constructed with a housing 31 having a generally rectangularly configured rear portion 310 with surface mounting electrical terminals 311 mounted therein. Each surface mounting electrical terminal 311 is connected by an electrical conductor or electrical conductor path with a connector pad 11011, FIG. 3, connected with a laser device 1100. As set forth in FIGS. 5, 6, receptacle member 30 is positioned onto plug member 11 so that each fiber of an optical cable may be connected via a laser device 1100 mounted within plug member 11 with components of a circuit board.

Although the drawing, FIG. 1, illustrates members 10 and 11 as receptacle and plug, respectively, it is to be understood that members 10 and 11 could also be plug and receptacle, respectively.

We claim:

1. Connector apparatus mounting a laser device for connecting an optical cable with a plug-in circuit board wherein said connector apparatus comprises means having a pair of silicon substrates each having a channel formed to receive an optical fiber of the optical cable and with each substrate secured to the other with one edge of the combination forming a planar surface perpendicular to a central axis of the optical fiber with an end of the optical fiber positioned within the planar surface and parallel thereto and having a pair of aligning pins formed to extend outward from the planar surface along the central axis, and means having a silicon assembly formed of a base mounting a laser device along one edge with an electrical terminal for connecting the laser device to the circuit board and wherein said assembly has a silicon cap formed with a cavity configured for receiving a top portion of the laser device and which cap is positioned in alignment with the base to maintain the laser device located in the base and cap assembly with an optical terminal positioned within another planar surface perpendicular to a central axis of the laser device optical terminal and having a pair of V configured grooves formed along opposite outer sides of the silicon assembly adjacent the other planar surface to slidably receive the aligning pins to engage the planar surfaces with each planar surface adjacent to the other planar surface and aligned parallel therewith to optically couple the laser device optical terminal with the optical fiber and thereby connect the optical cable with the circuit board.

2. The connecting apparatus set in claim 1 wherein said silicon assembly comprises
a silicon base having a pair of connector pads each located on an opposing edge of the base with each connector pad interconnected to the other connector pad by an electrical conducting path and having the laser device mounted along one edge with the electrical terminal affixed to one connector pad and with the optical terminal positioned within the other planar surface and parallel thereto.

3. The connecting apparatus set in claim 1 wherein said mounting apparatus means comprises
a pair of copper plates each placed outside of opposing sides of the silicon base and cap assembly for electrically and heat shielding the laser device.

4. The connecting apparatus set in claim 3 wherein said connecting apparatus means comprises
a pair of clip devices wherein one clip device is positioned over the pair of the silicon substrates and wherein the other clip device is positioned over a structure of the pair of copper plates and the silicon base and cap assembly for forming receptacle and plug members respectively.

5. The connecting apparatus set in claim 4 wherein said connecting apparatus means comprises
a retaining member affixed to the plug member clip device and a pair of retaining screws affixed to the receptacle member for engaging the retaining member for positioning the receptacle member planar surface adjacent the plug member planar surface with the optical cable fiber end aligned with and located adjacent the laser device optical terminal to couple the optical fiber with the laser device.

6. Apparatus for connecting an optical cable with a plug-in type of circuit board via laser devices mounted in the connecting apparatus wherein said connecting apparatus comprises
a receptacle having a pair of silicon substrates with parallel channels formed to receive fibers of the optical cable and wherein each substrate is secured to the other with one edge of the combination thereof forming a receptacle planar surface perpendicular to an axis of the receptacle with each end of the fibers aligned and positioned within and parallel to the receptacle planar surface and wherein the receptacle is formed with a pair of aligning pins extended outward from the receptacle planar surface along the receptacle axis;
a plug having a silicon base formed with a pair of rows of connector pads wherein each row is located on an opposing edge with each pad of one row interconnected to a corresponding pad of the other row by an electrical conducting path and mounting a plurality of lasers along one edge with each laser having an electrical terminal affixed to one connector pad with the corresponding pad connected to the circuit board and with each laser having an optical terminal positioned within and parallel to a plug planar surface perpendicular to an axis of the plug and wherein said plug has a silicon cap having a cavity formed for receiving a top portion of the lasers and positioned in alignment with the silicon base to maintain the lasers located in an assembly of the silicon base and cap with the laser optical terminals positioned within and parallel to the plug planar surface to correspond with ends of the fibers, a pair of copper plates each placed outside of opposing sides of the plug silicon base and cap assembly for electrically and heat shielding the lasers, and a pair of V configured grooves formed along opposite sides of the plug silicon base and cap assembly at angles corresponding to a crystalline structure of the silicon base and cap assembly for slidable receiving said aligning pins located on the receptacle to align and engage the plug planar surface with the receptacle planar surface thereby optically coupling each fiber with each laser optical terminal;
a pair of clip devices wherein one clip device is positioned over the pair of substrates and wherein the other clip device is positioned over the pair of copper plates and the silicon base and cap assembly for forming the receptacle and plug members; and
a retaining member affixed to the plug clip device and a pair of retaining screws affixed to the receptacle for engaging the retaining member for securing the receptacle to the plug.

7. A connector mounting laser devices for connecting an optical cable with a circuit board via the connector mounted laser devices wherein the connector comprises
a plug having a silicon structure formed of a pair of silicon substrates each having channels formed for receiving and aligning fibers of the optical cable and for terminating ends of the aligned fibers in a plug planar surface formed at an end of the plug perpendicular to a central axis of the plug with an end of the fibers positioned within the plug planar surface and parallel thereto and having a pair of aligning pins formed to extend outward from the plug planar surface along the plug central axis, and
a receptacle having a silicon assembly formed of a base mounting a plurality of laser devices along one edge each having an electrical terminal for connecting a laser device to the circuit board and wherein said assembly has a silicon cap formed with a cavity configured for receiving a top portion of the laser devices and which cap is positioned in alignment with the base to maintain the laser devices located in the base and assembly with each laser device optical terminal positioned within a receptacle planar surface perpendicular to a central axis of the receptacle and aligned with the plug planar surface such that each laser device optical terminal corresponds with an end of a corresponding fiber and having a pair of V configured grooves formed along opposite outer sides of the receptacle silicon assembly adjacent the receptacle planar surface to slidably receive the plug aligning pins to slidably engage the plug with the receptacle with each planar surface adjacent to the other planar surface and aligned parallel therewith to optically couple each connector laser device optical terminal with a corresponding optical fiber and thereby connect the optical cable with the circuit board.

* * * * *